United States Patent [19]

Yasuoka

[11] Patent Number: 4,616,405
[45] Date of Patent: Oct. 14, 1986

[54] SEMICONDUCTOR DEVICE AND MANUFACTURING METHOD THEREOF

[75] Inventor: Hideki Yasuoka, Musashino, Japan

[73] Assignee: Hitachi, Ltd., Tokyo, Japan

[21] Appl. No.: 691,061

[22] Filed: Jan. 14, 1985

Related U.S. Application Data

[60] Division of Ser. No. 378,737, May 17, 1982, abandoned, which is a continuation of Ser. No. 158,879, Jun. 12, 1980, abandoned.

[30] Foreign Application Priority Data

Jun. 29, 1979 [JP] Japan .................................. 54-81384

[51] Int. Cl.[4] ............................................ H01L 21/90
[52] U.S. Cl. ...................................... 29/578; 29/571;
29/577 C; 29/590; 29/591; 148/DIG. 10;
148/DIG. 11
[58] Field of Search ...................... 29/578, 577 C, 571;
148/DIG. 11, DIG. 10; 357/59, 71; 29/590,
591

[56] References Cited

U.S. PATENT DOCUMENTS

| | | | |
|---|---|---|---|
| 4,143,421 | 3/1979 | Tonnel et al. | 365/180 |
| 4,159,561 | 7/1979 | Dingwall | 29/578 |
| 4,170,501 | 10/1979 | Khajezadeh | 29/578 |
| 4,325,180 | 4/1982 | Curran | 29/577 C |
| 4,505,766 | 3/1985 | Nagumo et al. | 29/577 C |

OTHER PUBLICATIONS

Ayers et al, "Lateral PNP Transistor w/Emitter Field Plate" IBM Tech. Discl. Bull., vol. 19, No. 6, Nov. 76.
Lin et al, "Complementary MOS-Bipolar Transistor Structure" IEEE Trans. of Electronic Dev., vol. ED-16, Nov. 11, 69.

Primary Examiner—Brian E. Hearn
Assistant Examiner—Hunter L. Auyang
Attorney, Agent, or Firm—Antonelli, Terry & Wands

[57] ABSTRACT

A semiconductor device which comprises a semiconductor area having one principal surface, an emitter area and a collector area formed selectively and apart each other on the principal surface of said semiconductor area, a base area formed on said one principal surface between the emittor area and the collector area, an insulating film formed on said base area, and a high fusing point metallic film formed on said insulating film and covering said base area.

33 Claims, 29 Drawing Figures

SEMICONDUCTOR DEVICE AND MANUFACTURING METHOD THEREOF

This is a division of application Ser. No. 378,737, filed May 17, 1982, which is a continuation application of Ser. No. 158,879, filed June 12, 1980, both abandoned.

LIST OF PRIOR ART

The following references are cited to show the state of the art: Japanese Utility Model Publication No. 21934/1971 published on July 19, 1971.

BACKGROUND OF THE INVENTION

Conventionally lateral transistors with an emitter area and a collector area formed on the same principal surface are constructed so that the emitter-terminal covers the major part on a base area between the emitter area and the collector area by way of an insulation protective film as disclosed, for example, in Japanese Utility Model Publication No. 21934/1971. The structure is intended to minimize a recombination on the surface of base area of a carrier poured from the emitter to the base area by the emitter-terminal covering the major part on said base area.

In case, however, an element is manufactured practically in the structure as described above, the collector area must be widened or enlarged so as to keep the collector-terminal connected to said collector area and the emitter-terminal covering the major part on said base area from coming in contact each other. The lateral transistor cannot, therefore, be minimized in size due to this enlargement of the collector area as described, and an integration density cannot be made large particularly in such case where it is manufactured on the same substrate as other semiconductor element. Thus a big shortcoming is unavoidable with the lateral transistor proposed by said aforementioned Japanese Utility Model Publication.

BRIEF SUMMARY OF THE INVENTION

The first object of this invention is to present a new type of semiconductor device settling the shortcoming described above.

The second object of the invention is to present a manufacturing method of said new type of semiconductor device.

DESCRIPTION OF THE PREFERRED EMBODIMENTS

This invention relates to a semiconductor device with an emitter area and a collector area formed on one principal surface of the semiconductor area and to a manufacturing method thereof. The invention then relates particularly to a lateral transistor with the emitter and collector areas provided adjacently to each other on the same principal surface and to a manufacturing method thereof, and further relates to a semiconductor integrated circuit with said lateral transistor and an insulating gate type field effect transistor or a vertical transistor formed on the same substrate and also to a manufacturing method thereof.

Figure 1:
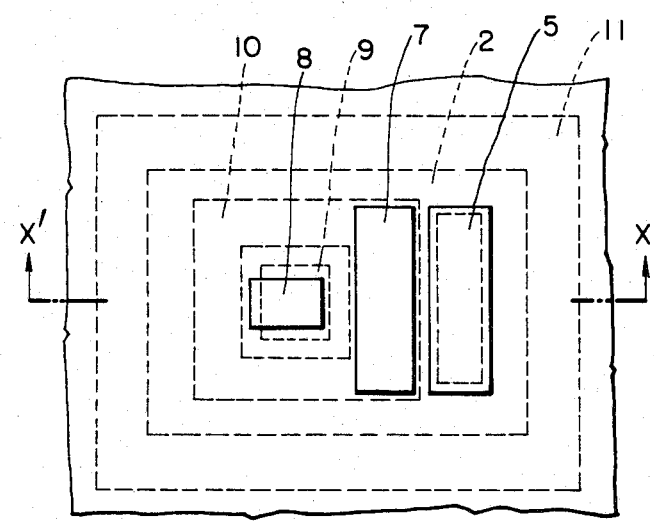
FIG. 1 is a plan view of a lateral transistor given in one embodiment of this invention.
Figure 2:
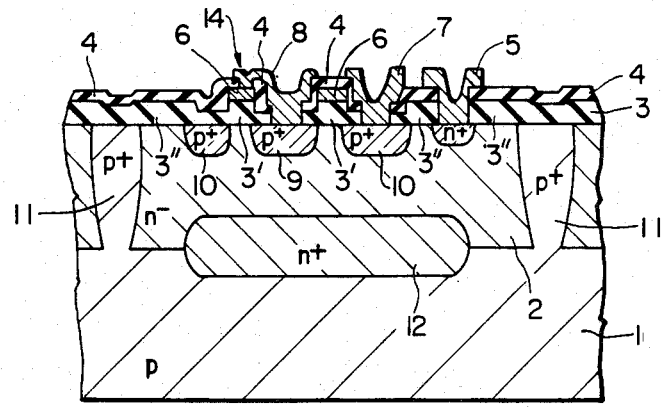
FIG. 2 is a sectional view of the transistor illustrated in FIG. 1.

Next, the lateral transistor given in one preferred embodiment of this invention will be described with reference to FIG. 1 and FIG. 2. FIG. 1 is a plan view of the lateral transistor given in one embodiment of the invention, wherein dotted lines represent a semiconductor area and continuous lines a metallic electrode. An insulating film and a conductor film coming between the semiconductor area and the metallic electrode are omitted. In the drawings, a reference numeral 9 indicates a $p^+$-type emitter area, 10 a ringed $p^+$-type collector area surrounding adjacently said emitter area 9, 2 a base area comprising an $n^-$-type epitaxial layer, 8 an emitter-terminal connected to said emitter area 9, 7 a collector-terminal connected to said collector area 10, and 5 a base-terminal connected to said base area 2. FIG. 2 is a sectional view of the lateral transistor taken on line X-X' in said plan view, wherein a reference numeral 1 indicates a p-type substrate, 2 an $n^-$-type epitaxial layer formed on said substrate 1, 11 a $p^+$-type isolation area isolating said epitaxial layer to a plural number of island areas, 12 a buried layer given in said p-type substrate, 9 an emitter area having a density of about $5 \times 10^{18} \sim 10^{22}/cm^3$ which is formed on one principal surface of said epitaxial layer 2, 10 a collector area having a density of about $5 \times 10^{18} \sim 10^{22}/cm^3$ which is formed on one principal surface of the epitaxial layer 2 in the same way and surrounding adjacently said emitter area, 3 an oxide silicon film formed on one principal surface of said epitaxial layer, which comprises at least a portion 3' positioned on the base area (on one principal surface of said epitaxial layer 2) coming between the emitter area 9 and the collector area 10 and a portion 3" essentially in the same thickness as said portion 3' which covers one principal surface of said epitaxial layer 2 other than said base area. Said oxide silicon films 3' and 3" are about 1μ thick each. A reference numeral 6 indicates an impurity doped polycrystal silicon layer about 5,000 Å thick which is formed on said oxide silicon film 3 and covered on the epitaxial layer 2 working as the base area between said emitter area 9 and collector area 10 and which is also positioned in a ring form on the base area between the emitter area 9 and the collector area 10. A reference numeral 4 indicates a phosphorous glass film about 5,000 Å $\sim$ 1μ thick which is formed on the surface of said polycrystal silicon layer 6 and the surface of the oxide silicon film 3, 5 a base-terminal connected to said base area 2, 7 a collector-terminal connected to the collector base 10, and 8 an emitter-terminal connected to the emitter area 9 and also to polycrystal silicon layer 6 doped with said impurity at a juncture 14. With this arrangement, it is not necessary for the emitter-terminal 8 to cover the base area 2 between the emitter area 9 and the collector area 10 because it can simply be connected to the polycrystal silicon layer 6 at least at one spot as said polycrystal silicon layer 6 covers said base area.

Thus in the lateral transistor according to this invention it is not necessary to have the emitter-terminal particularly formed on the base area so as to cover the overall base area as previously required, and hence the emitter-terminal and the collector-terminal are not kept so adjacent each other. It is therefore not necessary to prevent the collector-terminal from coming in contact with the emitter-terminal by widening the collector area technically as previously required. The collector area can therefore be made smaller than previously thus minimizing the transistor in size. In case it is formed particularly for semiconductor integrated circuit, the integration density can be improved reasonably.

Since the collector area is formed in a ring shape so as to surround the emitter area, the emitter-terminal and the collector-terminal are kept more apart from each other to increase the effect referred to above by connecting the collector-terminal to the collector area at a portion coming on the side opposite to that of the juncture 14 whereat said polycrystal silicon and the emitter-terminal are connected. Furthermore, the ringed polycrystal silicon layer on the semiconductor area coming between the emitter area and the collector area thus covers thoroughly the space between said emitter area and collector area, and the emitter-terminal is connected to said polycrystal silicon layer, therefore the potential on the space between said emitter area and collector area, i.e. the potential on the base area is fixed by emitter potential and a charge on the interface of oxide silicon film and silicon, a moving charge in the oxide silicon film, a moving charge on the oxide silicon film, etc. can be fixed by said polycrystal silicon layer 6, and thus a fluctuation and a surface recombination of the carrier poured from the emitter area to the base area at the time of transistor operation by said moving charges can be prevented, thereby obtaining a superior effect including improvement in current gain of the lateral transistor, improvement in noise characteristic and prevention of a secular deterioration. Moreover, since the n+-type buried area 12 is present under the emitter and collector areas as will be apparent from FIG. 2, the carrier pouring in the direction of p-type substrate from the emitter area can be regulated or removed by said N+ buried layer and thus the reactive current to flow in the direction of P-type substrate can be decreased or removed to improve current gain even further. Then, the collector area surrounds the emitter area in a ring form, therefore a peripheral length of the emitter can be used effectively and the carrier from the emitter area can be collected usefully or with better efficiency in the collector area, thus leading to a further improvement in current gain.

Figure 3:
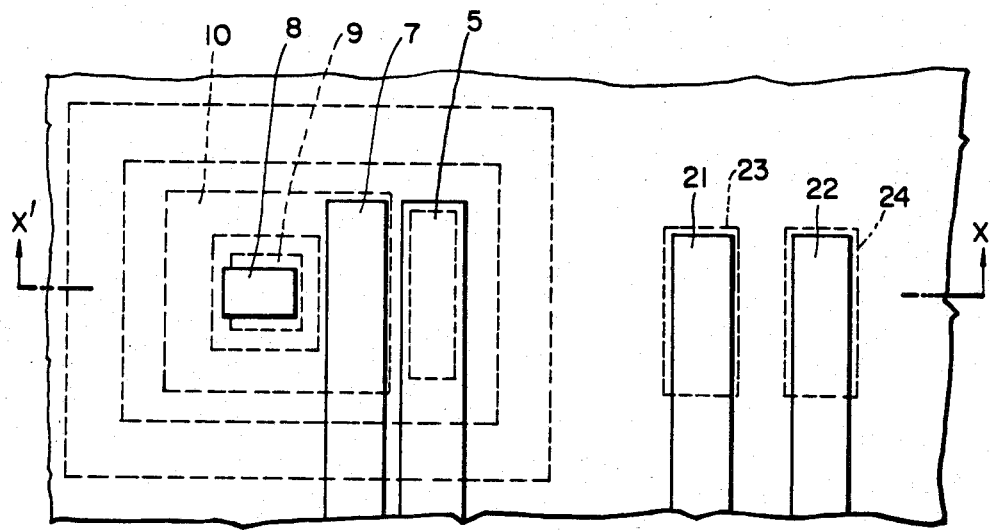
FIG. 3 is a plan view of a semiconductor integrated circuit with the lateral transistor according to this invention and a silicon gate type field effect transistor formed on the same substrate.
Figure 4:
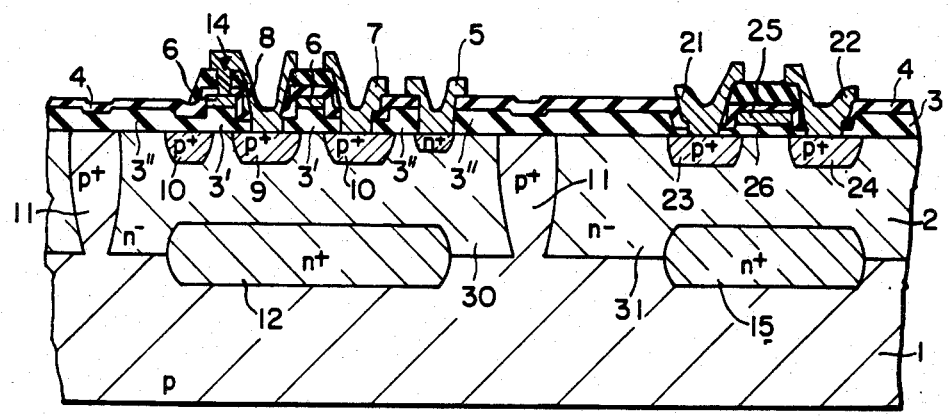
FIG. 4 is a sectional view of said semiconductor integrated circuit.
Figure 5A:
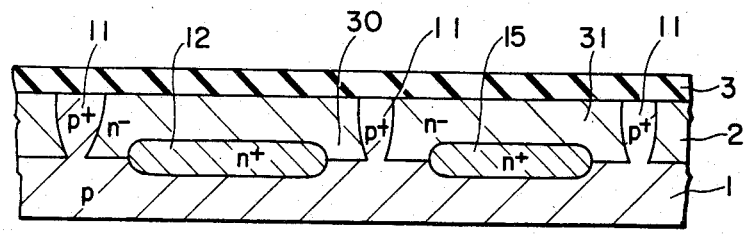
FIGS. 5, (a) through (j) are sectional views indicating a manufacturing process of the semiconductor integrated circuit shown in FIG. 3 and FIG. 4.
Figure 5B:
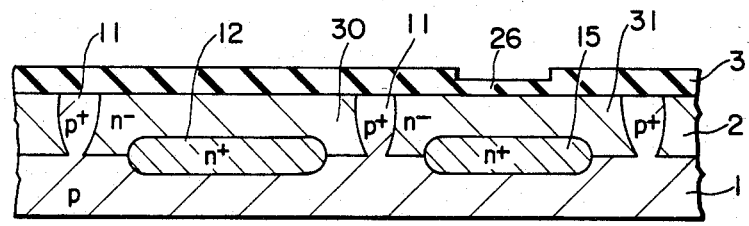
Figure 5C:
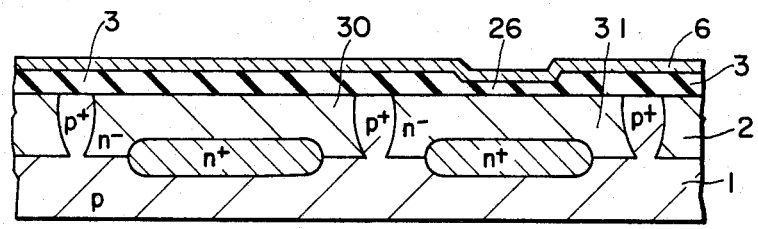
Figure 5D:
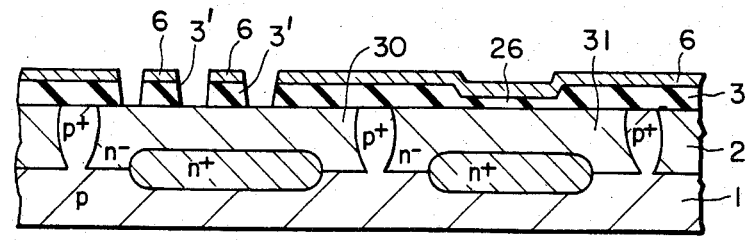
Figure 5E:
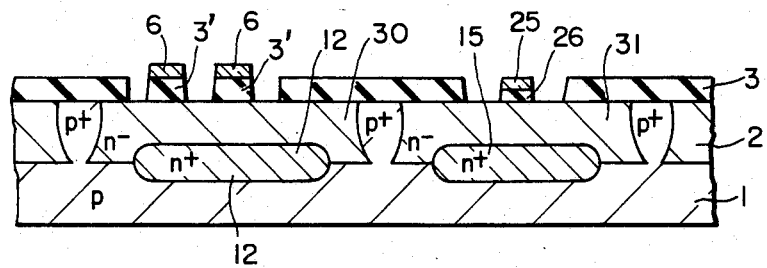
Figure 5F:
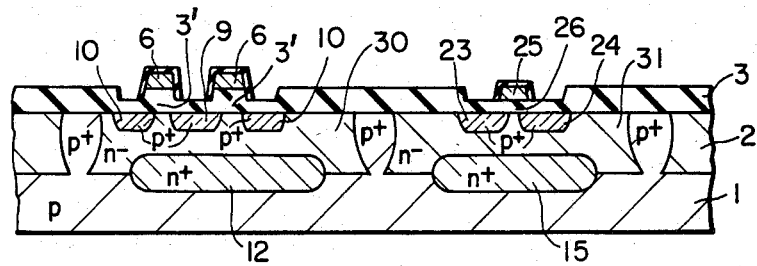
Figure 5G:
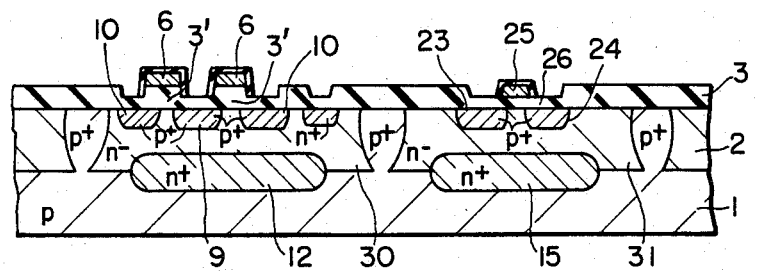
Figure 5H:
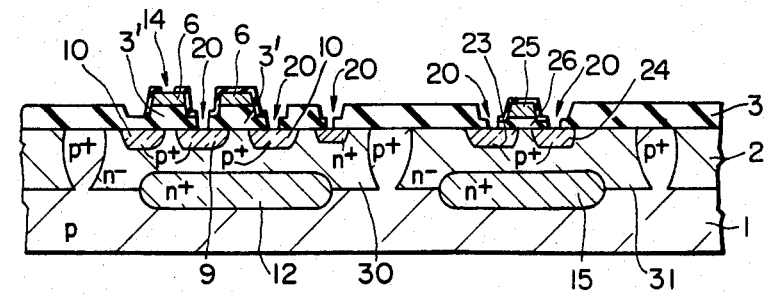
Figure 5I:
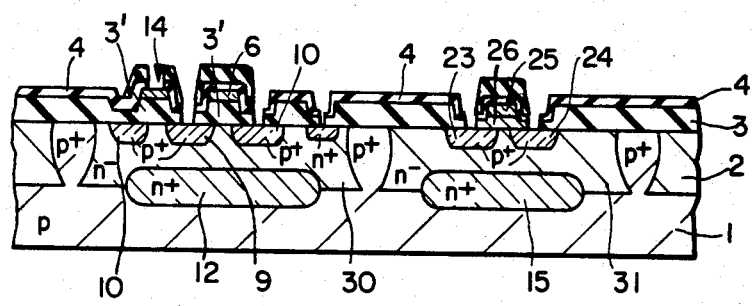
Figure 5J:
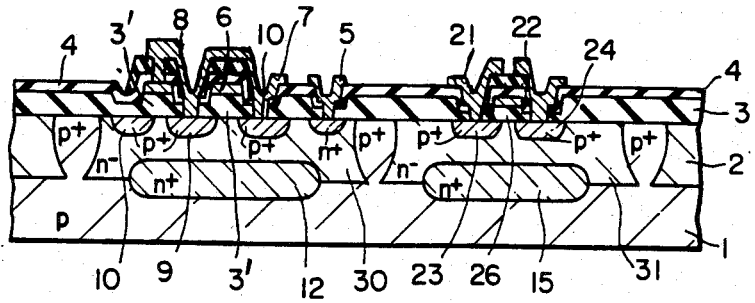
Figure 6A:
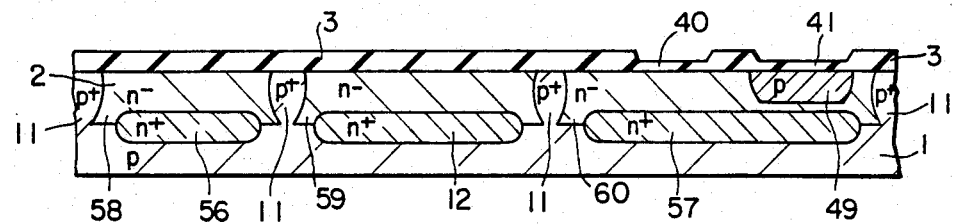
FIGS. 6, (a) through (l) are sectional views indicating each manufacturing process for forming a vertical transistor and a complementary field effect transistor on the same semiconductor substrate.
Figure 6B:
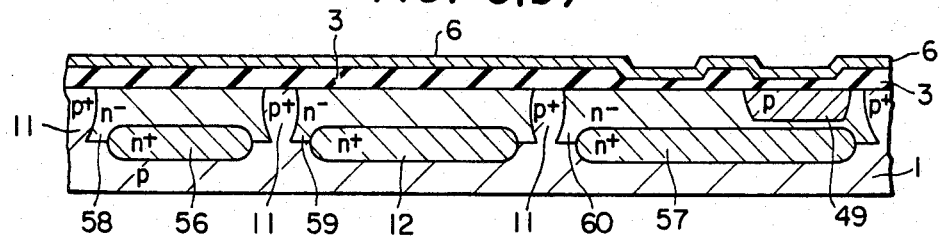
Figure 6C:
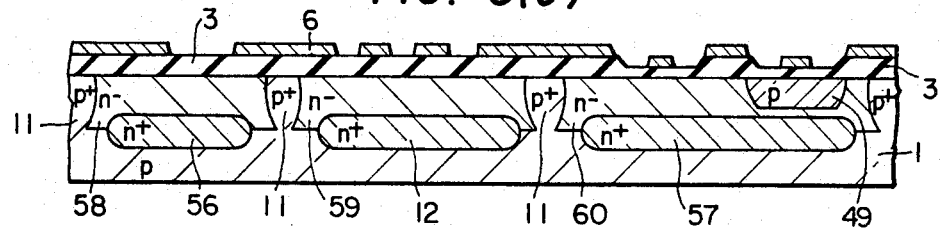
Figure 6D:
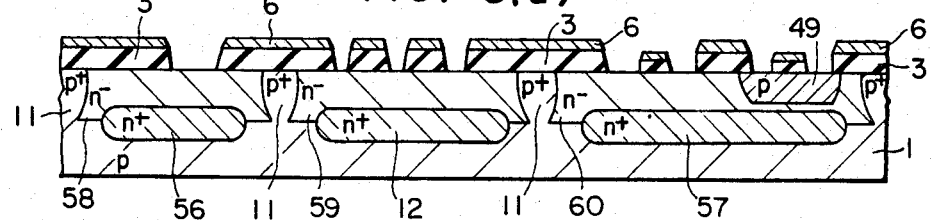
Figure 6E:
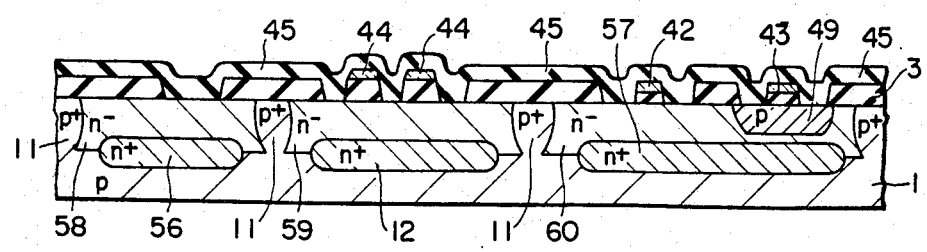
Figure 6F:
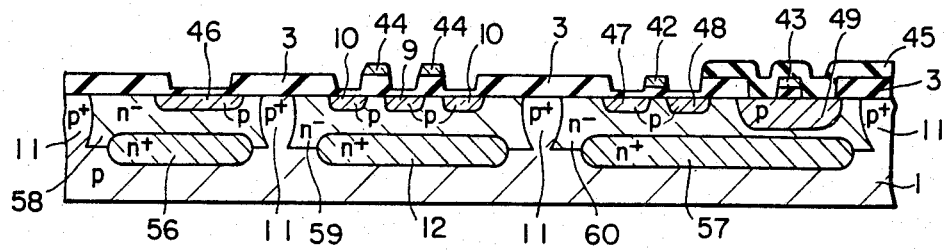
Figure 6G:
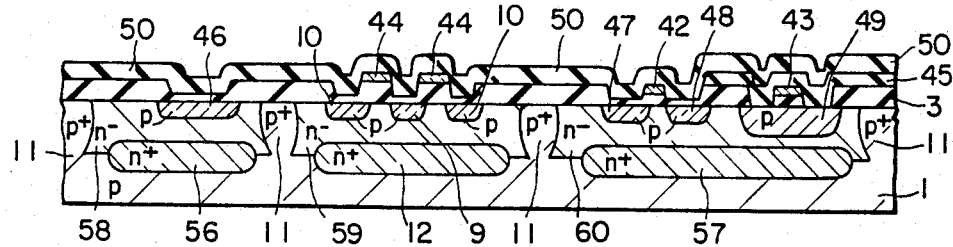
Figure 6H:
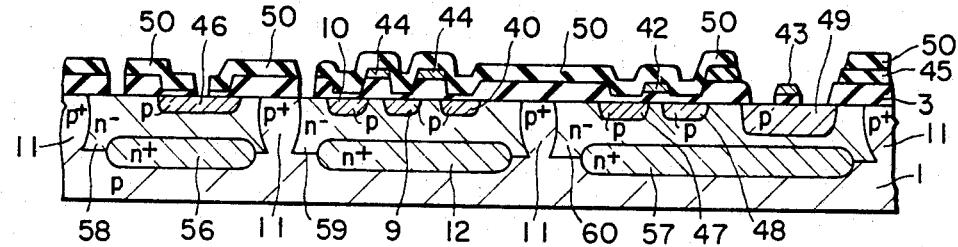
Figure 6I:
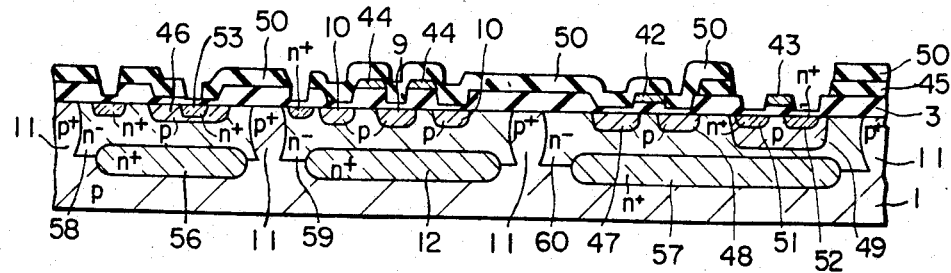
Figure 6J:
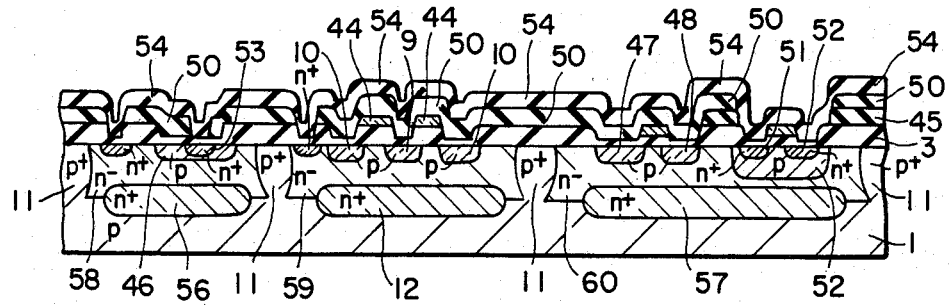
Figure 6K:
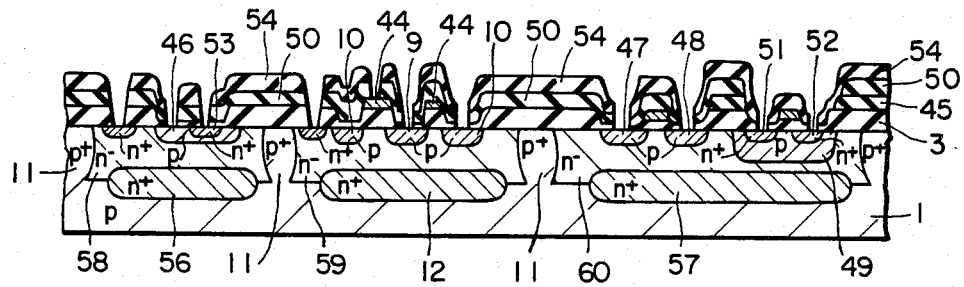
Figure 6L:
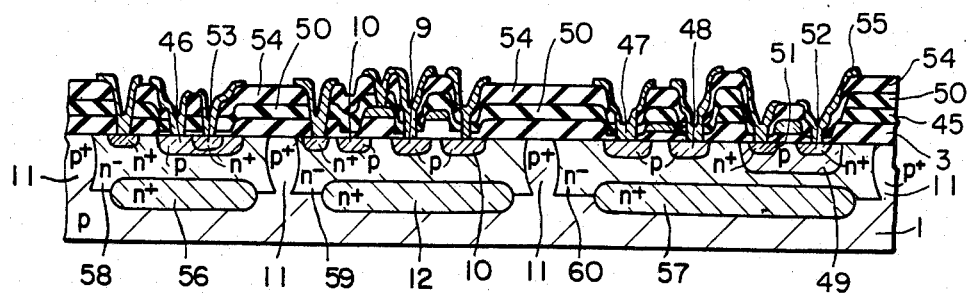

Next, a semiconductor integrated circuit with the lateral transistor according to one preferred embodiment of the invention as described above and a silicon gate type field effect transistor (hereinafter referred to as Si gate MOS) formed on the same substrate is described with reference to FIG. 3 and FIG. 4 as follows:

In FIGS. 3 and 4 the same part or member as FIG. 1 and FIG. 2 is indicated by the same reference numeral.

FIG. 3 is a plan view of a semiconductor integrated circuit including the lateral transistor according to the invention and a p-channel Si gate MOS. Dotted lines indicate a semiconductor area and continuous lines indicate a metallic electrode. Then, an insulating film and a semiconductor film present between said semiconductor area and metallic electrode are omitted. In the figure the lateral transistor coming on the left side is identical to FIG. 1 described hereinbefore and hence has the same reference numerals as FIG. 1 in detail. In Si gate MOS on the right side, a numeral 23 indicates a p+-type source area, 24 a p+-type drain area, and 21 and 22 a source-terminal and a drain-terminal connected to said source and drain areas respectively. FIG. 4 is a sectional view of the device taken on line X-X' in FIG. 3. In the figure the same part or member as FIG. 2 is indicated by the same referential numeral as FIG. 2 and so described as referred to hereinabove. An N−-type epitaxial layer 2 is formed on a p-type substrate 1, and n+-type buried areas 12, 15 are present between said epitaxial layer 2 and p-type substrate. The epitaxial layer 2 is isolated to a plural number of island areas 30, 31 including said buried areas 12, 15 respectively by a p+-type isolation area 11. There are formed a PNP-type lateral transistor and a p-channel Si gate MOS on said plural number of island areas 30, 31 respectively. A ringed collector area 10 surrounding the emitter area 9 adjacently to the emitter area 9 is given in the island area 30 in which the n+ buried area 12 is present, and both the emitter and collector areas are formed on one principal surface of said island area 30. Then a polycrystal silicon layer 6 covering the entire base area by way of an oxide silicon film 3' is formed on the base area (epitaxial layer) between said emitter area and collector area. A part of said polycrystal silicon layer 6 is connected to the emitter-terminal 8 at a juncture 14 which is connected to said emitter area 9. The oxide silicon film is formed on one principal surface of the island area 30 and comprises the oxide silicon film 3' positioned on the base area between said emitter and collector areas and an oxide silicon film (field oxidized film) 3" positioned on one principal surface of said island area 30 other than said base area, both of which are of a thickness essentially. There are then formed a source area 23 and a drain area 24 on one principal surface of the island area 31 having an n+ buried area 15, and a gate oxide silicon film 26 is present on the island area 31 between said two areas. A gate polycrystal silicon layer 25 is formed on said gate oxide silicon film 26. An oxide silicon film (field oxidized film) 3 is formed on one principal surface of the island area 31 other than the gate oxide silicon film 26.

In the structure described above, the polycrystal silicon layer 6 positioned on the base area of the lateral transistor and the polycrystal silicon layer on the gate unit of Si gate MOS are formed in the same polycrystal silicon layer. Then, the oxide silicon film 3' on the base area of the lateral transistor is thicker than the gate oxide silicon film 26 of the Si gate MOS. The above structure is still available to bringing about the effect described hereinabove on the lateral transistor, and the Si gate MOS has n+-type buried area under source and drain areas to decrease the reactive current flowing in the direction of p-type substrate, thereby improving further the characteristic of said MOS. Then, the lateral transistor can be taken smaller in size, which is capable of realizing a semiconductor integrated circuit with better integration density.

Next, a manufacturing method of the semiconductor device embodied in FIG. 3 and FIG. 4 is described with reference to FIGS. 5, (a) through (j) as follows: As will be apparent from FIG. 5, (a), an n⁻-type epitaxial layer 2 is formed on p-type substrate having n⁺-type buried areas 12, 15, and the epitaxial layer 2 is isolated to a plural number of island areas 30, 31 by p⁺-type area 11. Then an oxide silicon film 3 about 1μ thick is formed on one principal surface of said epitaxial layer 2. The oxide silicon film 3 on said island area 31 is etched selectively, as illustrated in FIG. 5 (b), and a new oxide silicon film 26 about 500~1,500 Å thick which works as a gate oxide silicon film is formed on the etched zone. And then like FIG. 5 (c), a polycrystal silicon layer 6 about 1μ thick is formed on said oxide silicon films 3 and 26. Then as shown in (d), the polycrystal silicon film 6 on one principal surface of the emitter and collector areas of the lateral transistor in the island area 30 is removed selectively through etching and further the oxide silicon film 3 is removed selectively through etching with the polycrystal silicon film 6 left unetched then as a mask. Next, as shown in (e), the polycrystal silicon film 6 of the island area 31 for source and drain areas is removed selectively, and then the oxide silicon film 3 is removed selectively with the polycrystal silicon 25 left unetched then as a mask. And as shown in (f), boron is diffused in the island areas 30 and 31 through portion where said oxide silicon film 3 has been removed, and thus p⁺-type emitter area $5 \times 10^{18} \sim 10^{22}/cm^3$ in impurity density, collector area 10, source area 23 and drain area 24 are formed concurrently. In this case, the polycrystal silicon layers 6 and 25 are doped with said boron to be good conductors both. Then, surfaces of the polycrystal silicon layers 6 and 25 are oxidized to be oxide silicon films about 5,000 Å thick, and said polycrystal silicon layers 6 and 25 are about 5,000 Å thick consequently. And there is formed an oxide silicon film several 1,000 Å thick on the surfaces of emitter area 9 formed through said diffusion, collector area 10, source area 23 and drain area 24. Next as shown in FIG. 5 (g), the oxide silicon film 3 on a base contact zone of the island area 30 is removed selectively, and phosphorus is diffused in said island area 30 through portion where removed as above to form an n⁺-type base contact area having a density at $5 \times 10^{19} \sim 10^{21}/cm^3$. Like said figure (h) furthermore, oxide silicon films on emitter area 9, collector area 10, base contact area, source area 23 and drain area 24 are removed selectively through etching to form a junction 20 of said each area and an aluminum wiring; in this case the oxide silicon film on the surface of the polycrystal silicon layer 6 which covers the base area between emitter area 9 and collector area 10 is also removed selectively to form a junction 14. Next as shown in (i), a phosphorus glass film 4 about 5,000 Å~1μ thick is formed on the overall surface of said oxide silicon film 3, and the phosphorus glass film on said contact zone is removed selectively. And then as shown in (j), aluminum is spattered on said contact zone, and a plural number of aluminum electrodes are formed by removing the spattered aluminum selectively through etching. Reference numerals 21, 22 indicate source- and drain-terminals, and 8, 7, 5 indicate emitter-, collector- and base-terminals respectively. Said emitter-terminal 8 is connected to the polycrystal silicon layer 6 at said junction 14. This indicates that a plural number of electrodes described above are formed through the same process.

The manufacturing method according to the present invention has the following effects for manufacturing a semiconductor integrated circuit with the lateral transistor and the MOS transistor formed on the same substrate. The polycrystal silicon layer formed through the process given in FIG. 5 (c) is available as the polycrystal silicon layer 6 covering the base area of the lateral transistor and also as the polycrystal silicon layer 25 of the gate unit of silicon gate MOS, or in other words the polycrystal silicon layer for the formation of Si gate of the Si gate MOS applies to the lateral transistor, therefore the lateral transistor can be manufactured with ease and said polycrystal silicon layer can also be utilized usefully and effectively.

Furthermore, since emitter and collector areas for the lateral transistor can be formed with said polycrystal silicon layer as a mask, said emitter and collector areas can be placed automatically in position by said polycrystal silicon layer. Thus, not only the distance between emitted and collector areas of the lateral transistor can be minimized but also the polycrystal silicon layer can be placed in position accurately on the base area.

In addition, source and drain areas of the Si gate MOS can be formed simultaneously with emitter and collector areas of the lateral transistor, and hence the semiconductor integrated circuit with the lateral transistor and the MOS transistor formed on the same substrate can be manufactured with ease.

As described, since a special process is not particularly required for manufacturing the lateral transistor framed according to the present invention, a semiconductor integrated circuit for which a plural number of elements are formed on the same substrate or particularly an integrated circuit for which bipolar element and MOS element are integrated can be manufactured with ease, and thus the method is very advantageous for the manufacture.

A manufacturing process for making the lateral transistor, the vertical transistor and the complementary MOS (C-MOS) on the same semiconductor substrate is described with reference to FIGS. 6, (a) through (l) as follows: First as shown in FIG. 6 (a), an n⁻-type epitaxial layer 2 is formed on the p-type semiconductor substrate 1 provided with n⁺-type buried areas 12, 56, 57, and a plural number of p⁺-type semiconductor areas 11 isolating the epitaxial layer 2 to a plural number of island areas 58, 59, 60 and a p-type well area 49 positioned on one principal surface of said island area 60 are formed in said epitaxial layer 2. Said p-type well area 49 can be formed through ion implantation and stretching diffusion, and boron will be used for impurity in this case. The oxide silicon film 3 on said p-type well area 49 and also on the surface of said island area 60 other than the well area 49 is removed selectively, and gate oxidized films 40, 41 about 500~1,500 Å thick are formed by reoxidizing the portion where removed as above. Next, as shown in said figure (b), a polycrystal silicon layer 6 about 1 μ thick is formed on said oxide silicon film 3 and gate oxidized films 40, 41. Then said polycrystal silicon layer 6 is removed selectively as illustrated in (c). Further as shown in FIG. 6 (d), the oxide silicon film 3 and the gate oxidized films 40, 41 under said polycrystal silicon layer 6 is removed selectively with the polycrystal silicon layer 6 left unremoved then as a mask. The other unnecessary polycrystal crystal silicon layer 6 than polycrystal silicon layers 44, 42, 43 remaining on the island areas 59 and 60 is removed through etching as illustrated in (e), and an oxide silicon film 45 is formed through CVD process on the remaining polycrystal silicon layers 44, 42, 43 and the oxide silicon layer 3. Then like said figure (f), only the oxide silicon film on the p-type well area 49 is left and the oxide silicon film 45 on the other parts is removed selectively, a given portion on one principal surface of the island areas 58, 59, 60 is exposed, the base area 46 of the vertical transistor $5 \times 10^{18} \sim 10^{22}/cm^3$ in impurity density, the emitter area 9 and the collector area 10 of the lateral transistor, the source area 47 and the drain area 48 of the p-channel MOS are formed concurrently in the island areas 58, 59, 60. Boron is diffused in polycrystal silicon layers 44 and 42 in this case, and thus said silicon layers 44 and 42 become good conductors. As described above in this process, emitter and collector areas of the lateral transistor, source and drain areas of the p-channel MOS and base area of the vertical transistor are formed in the same process, which is advantageous in view of shortening the manufacturing process, however, some trouble may be unavoidable for the improvement of characteristics of each element as said each area becomes nearly even in density. If so and for further improvement, for example, in $h_{fe}$ of the vertical transistor, it is preferable to take the density of base area lower than said density. In this case the density will have to be taken low at $5 \times 10^{17} \sim 10^{19}/cm^3$ for example by separating the formation process of the base area 46 from that of other areas. Next as shown in said figure (g), an oxide silicon film 50 about 1,500~5,000 Å thick is formed through CVD process on island areas 58, 59, 60 for which said emitter, collector, source and drain areas are formed as the oxide silicon film 45 on the p-type well area 49 is residual and also on p+-type area 11. Further as shown in said figure (h), the oxide silicon film 50 and the oxide silicon film 45 on said p-type base area 46, island area 58 other than said base area, island area 59 other than emitter area 9 and collector area 10, p-type well area 49 are removed selectively. Photoresist technique applies for the removal in this case. And as shown in said figure (i), collector takeout N+-type area of the vertical transistor, base takeout N+-type area of the lateral transistor, emitter area 53 of the vertical transistor, source area 51 and drain area 52 of the n-channel MOS are formed by diffusing an N-type impurity or "phosphorus" for example to the portion where said oxide silicon film has been removed selectively. In this case, "phosphorus" is also diffused in the polycrystal silicon layer 43 on the p-type well area, which becomes a conductor consequently. Next as shown in said figure (j), a phosphorous glass film 54 about 3,000~10,000 Å thick is formed on said each island area. Then as shown in said figure (k), the oxide silicon films 50 and 54 on emitter area 53, base area 46 and collector takeout area of the vertical transistor, base takeout area, emitter area 9 and collector area 10 of the lateral transistor, source area 47 and drain area 48 of the p-channel MOS, and source area 51 and drain area 52 of the N-channel MOS are removed selectively, and a window opening for taking the contact out of each area is formed. In this case the oxide layers 50 and 54 on the polycrystal silicon layer 44 present on the base area of the lateral transistor in the island area 59 are also removed selectively. Then as shown in said figure (l), an aluminum layer is formed through vacuum evaporation on each area for which the contact taking out window has been opened, and then said aluminum layer is removed selectively to form an aluminum electrode 55 connected to the polycrystal silicon layer 44 on each area of said vertical transistor, lateral transistor and C-MOS and also on base area of the lateral transistor. A part of the aluminum electrode connected to the emitter area 9 of the lateral transistor is connected to the polycrystal silicon layer 44 on the base area of said lateral transistor.

The vertical transistor, the lateral transistor and the C-MOS can be formed in the same conductor substrate through the process described above.

Figure 7:
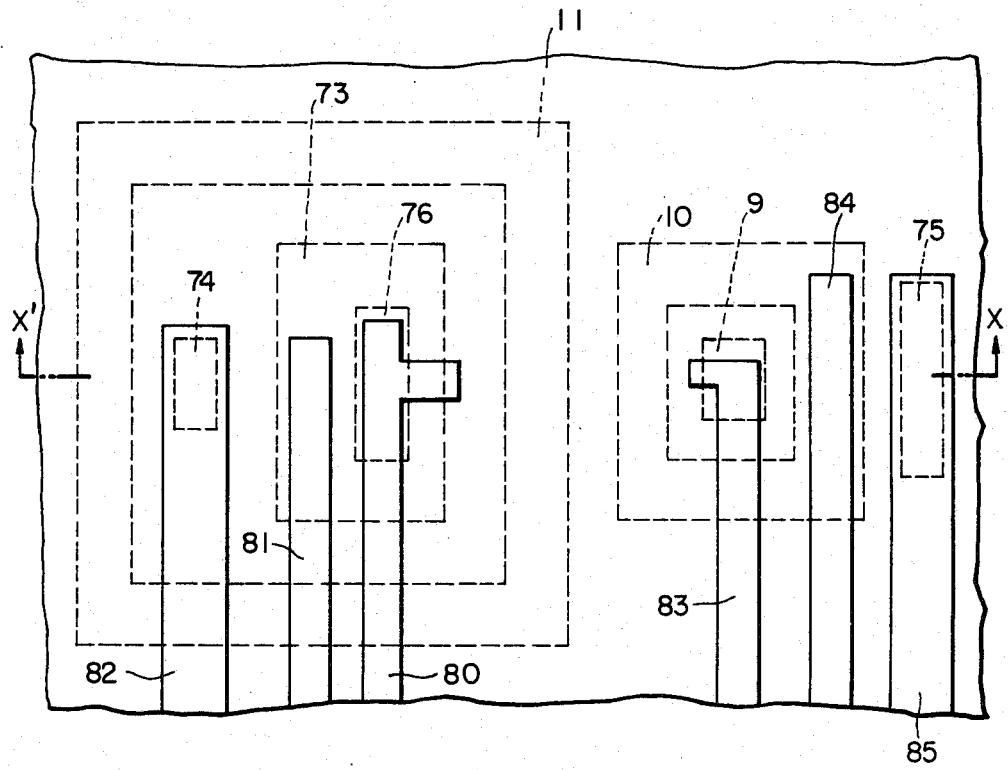
FIG. 7 is a plan view of a semiconductor device with a lateral transistor and a vertical transistor which are given in another embodiment of the invention formed on the same substrate.
Figure 8:
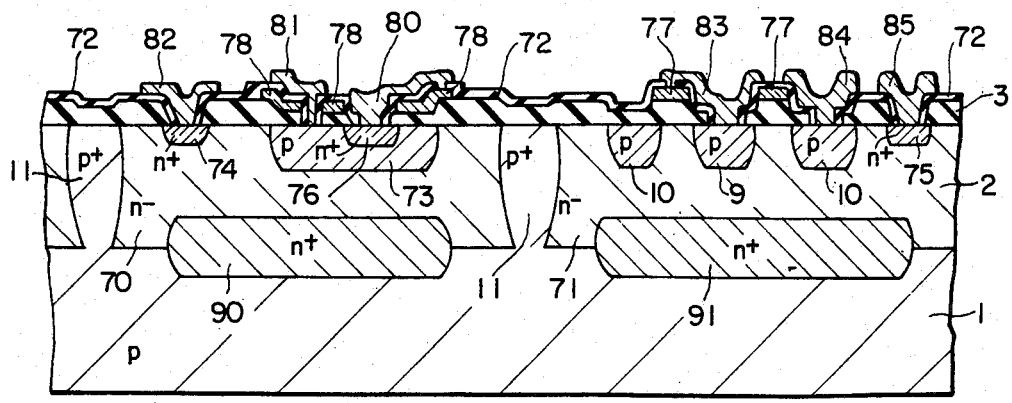
FIG. 8 is a sectional view of the semiconductor device shown in FIG. 7.

The invention will now be described for an embodiment of a vertical transistor and a lateral transistor formed together with reference to FIG. 7 and FIG. 8. FIG. 7 is a plan view illustrating both vertical and lateral transistors being formed on the same substrate. In said figure dotted lines indicate a semiconductor area to constitute the vertical transistor and the lateral transistor therein; continuous lines indicate a metallic electrode connected to said semiconductor area. An insulating film and a conductor film present between said semiconductor area and metallic electrode are omitted. In said figure, a reference numeral 76 indicates an emitter area of the vertical transistor, 73 a base area and 74 a collector-terminal takeout area. Reference numerals 80, 81, 82 indicate an emitter-terminal, a base-terminal and a collector-terminal connected to said each area respectively. A reference numeral 11 indicates an isolation area surrounding the vertical transistor, 9 an emitter area of the lateral transistor, 10 a collector area, 75 a base-terminal takeout area. Reference numerals 83, 84, 85 indicate an emitter-terminal, a collector-terminal and a base-terminal connected to said each area respectively. FIG. 8 is a sectional view taken on line X-X' of FIG. 7. In said figure, a reference numeral 1 indicates a p-type substrate, 2 an n−-type epitaxial layer formed on said substrate 1, 11 an isolation area to isolate said epitaxial layer to island areas 70, 71, 90 a buried area given between said island area 70 and p-type substrate 1, 91 a buried area given between said island area 71 and p-type substrate 1. A p-type base area 73 is formed on one principal surface of said island area 70; and N+-type emitter area is formed on the surface of said base area 73. An N+-type collector-terminal takeout area 74 is formed away from said base area 73. There are formed a p-type emitter area 9 and a collector area 10 surrounding adjacently said emitter area 9 on one principal surface of said island area 71. A base-terminal takeout area 75 is formed away from said collector area 10. A reference numeral 3 indicates an insulating film covering one principal surface of said island areas 70 and 71. A polycrystal silicon film 3 doped with impurities which covers the base area 73 formed in said island area 70 is formed on said insulating film 3. A polycrystal silicon film doped with impurities which covers the n−-type epitaxial layer 2 (base area) between the emitter area 9 and the collector area 10 formed in said island area 71 is formed on said insulating film 3. There is formed a phosphorous glass film 72 on said polycrystal silicon films 78, 77 and insulating film 3. A contact window is provided in the phosphorouss glass film 72 on said island area 70 to expose the emitter area 76, the base area 73 and the collector-terminal takeout area 74 therethrough. An emitter-terminal 80, a base-terminal 81 and a collector-terminal 82 are formed through said contact window. The emitter-terminal 70 is connected electrically to a part of said polycrystal silicon film 78. A contact window is also formed in the phosphorous glass film on said island area 71 to expose the emitter area 9 and the collector area 10 therethrough. Then, an emitter-terminal 83, a collector-terminal 84 and a base-terminal 85 are formed through said contact window. Said emitter-terminal 83 is connected electrically to said polycrystal silicon film.

In the semiconductor device with the lateral transistor and the vertical transistor formed on the same substrate, the following superior effects can be obtained in addition to the effect realized for the lateral transistor illustrated in FIG. 1 and FIG. 2 described hereinabove. In the vertical transistor formed in the island area 70, noise characteristic and $h_{FE}$ are improved. This is so resultant from a moving charge present in the insulating film on the base area 73 being fixed by the polycrystal silicon film 78 on said base area 73. A metallic layer of molybdenum or tungsten can be used instead of said polycrystal silicon films 77, 78.

Figure 9:
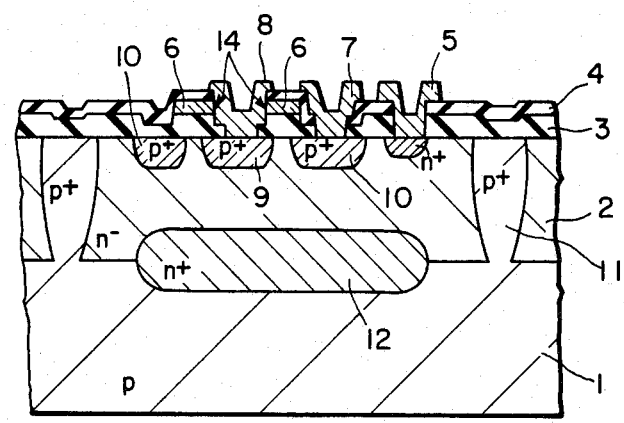
FIG. 9 is a sectional view of the lateral transistor according to another embodiment of the invention.

The invention may be practiced otherwise than as specifically illustrated and described hereinabove, and for this purpose, in the structure shown in FIG. 1 and FIG. 2, it is not necessary to have the emitter area particularly surrounded with the collector area, and both the areas can be formed adjacently each other in parallel. Then as shown in FIG. 9, the junction 14 whereat the polycrystal silicon layer 6 and the emitter-terminal 8 are connected can be given on the side of polycrystal silicon layer 6. Furthermore, what is connected to the polycrystal silicon layer 6 may be the collector-terminal 7 instead of the emitter-terminal 8. It goes without saying that in this case the emitter-terminal 7 and the polycrystal silicon layer 6 will have to be insulated by way of an insulating layer or the like. And instead of connecting to the emitter-terminal or the collector-terminal, the polycrystal silicon layer 6 can be connected to other constant potential through metallic wiring (aluminum wiring). An insulator like sapphire can be used for P-type substrate 1. An oxide silicon film can be used for the phosphorous glass film 4. The $n^+$-type buried layer 12 is not always indispensable but its presence is preferable for characteristic improvement. The conductive type of each area may be reverse, too. The thickness of oxide silicon film 3 can be set freely in the range coming in 5,000 Å $\sim$ 1.5$\mu$. In the semiconductor integrated circuit shown in FIG. 3 and FIG. 4, the Si gate MOS may be N-channel MOS. In this case, however, p-type well area is formed in the $N^-$-type epitaxial layer, and N-type source area and drain area are formed in the p-type well area, and further as shown in FIG. 4, to provide $n^+$ buried layer under the p-type well area like p-channel Si gate MOS is available to suppressing an extension of the depletion layer from said well area at said $n^+$ buried layer, preventing a punch-through between said p-type well area and the substrate and thus to improving a pressure resistance of MOS, thereby bringing a superior effect. Further in the manufacturing process given in FIGS. 5, (a) through (j), the phosphorous glass film 4 can be formed on the oxide silicon film 3 after FIG. 5 (g) and before formation of the contact unit 20. In this case the contact unit can be formed at one time, which is to shorten the manufacturing process.

Furthermore, the polycrystal silicon layer present on the base area between emitter area and collector area of the lateral transistor is a high melting point of metallic silicon layer to which impurities are added, however, a metallic layer of molybdenum, tungsten, etc. can be used instead of said silicon layer. As in the case of polycrystal silicon layer, said molybdenum and tungsten work as a mask at forming emitter area and collector area of the lateral transistor and are capable of placing said emitter and collector areas automatically in position. Both can be used for a gate electrode of the MOS transistor and also for a mask in this case at the time of forming source and drain areas.

Either N-type or P-type impurity can be used as an additive to the polycrystal silicon layer.

Instead of said phosphorous glass film, $SiO_2$ film to which impurity is not added can be formed. Said $SiO_2$ film will be that of being formed through, for example, CVD (chemical vapor deposition) process.

What is claimed is:

1. A manufacturing method for forming a semiconductor device, comprising the steps of:
    forming a first insulating film on one principal surface of a semiconductor substrate;
    forming a conductive film on said first insulating film;
    removing said conductive film selectively to leave said conductive film at a given portion on said first insulating film;
    removing said first insulating film selectively, with the conductive film left at a given portion used as a mask;
    forming emitter and collector areas in surface regions extending to said one principal surface of said semiconductor substrate by introducing impurities where said first insulating film has been removed;
    forming a second insulating film at least on the given portion of the conductive film left on the first insulating film;
    removing said second insulating film selectively to expose at least a part of the given portion of the conductive film left on the first insulating film; and
    forming a first conductor layer electrically connecting the exposed part of the given portion of the conductive film and said emitter area or collector area.

2. The manufacturing method according to claim 1, wherein said conductive film includes a polycrystalline silicon film.

3. The manufacturing method according to claim 1, wherein said conductive film is made of a metal.

4. The manufacturing method according to claim 1, wherein said semiconductor substrate comprises a semiconductor layer formed on a substrate.

5. The manufacturing method according to claim 1, wherein said forming a conductor layer is a step of forming a conductor layer electrically connecting the exposed part of the given portion of the conductive film to said emitter area.

6. The manufacturing method according to claim 5, wherein the conductor layer is made of a metal.

7. The manufacturing method according to claim 6, wherein the conductive film is made of a high melting point conductive material.

8. The manufacturing method according to claim 7, wherein the high melting point conductive material is selected from the group consisting of polycrystalline silicon having impurities added thereto, molybdenum and tungsten.

9. The manufacturing method according to claim 7, wherein the high melting point conductive material is a high melting point metal.

10. The manufacturing method according to claim 7, further including the step of forming another conductor layer, said another conductor layer being connected to the collector area and being insulated from the conductive film by way of the second insulating film.

11. The manufacturing method according to claim 1, wherein the collector and emitter areas are formed to be located at respective sides of the conductive film selectively left at a given portion on said first insulating film, whereby said conductive film selectively left at a given portion on said first insulation film covers an area of said one principal surface between said emitter and collector areas.

12. The manufacturing method according to claim 1, further including the step of forming another conductor layer, said another conductor layer being connected to the other of the emitter area or collector area and being insulated from the conductive film by way of the second insulating film.

13. A manufacturing method for forming a semiconductor device, comprising the steps of:
   forming a first insulating film on one principal surface of a semiconductor substrate;
   removing said first insulating film selectively;
   forming a second insulating film thinner than said first insulating film on a portion of the substrate where said first insulating film has been removed;
   forming a conductive material layer on said first and second insulating films;
   removing said conductive material layer selectively to leave a first conductive film on said first insulating film and a second conductive film on said second insulating film;
   removing said first and second insulating films selectively by using said first and second conductive films as a mask;
   forming emitter and collector areas in the semiconductor substrate at areas of the semiconductor substrate at which said first insulating film has been removed, and source and drain areas in the semiconductor substrate at areas of the semiconductor substrate at which said second insulating film has been removed, by introducing impurities into the semiconductor substrate at areas at which the emitter and collector areas, and source and drain areas, are to be formed;
   forming a third insulating film on said first and second conductive films;
   removing selectively the third insulating film on said first conductive film to expose at least a part of said first conductive film; and
   forming a conductor layer connecting the part of the first conductive film, exposed by removal of said third insulating film, and said emitter area or collector area.

14. The manufacturing method according to claim 13, wherein said conductive material layer includes a layer of polycrystalline silicon.

15. The manufacturing method according to claim 13, wherein said conductive material layer includes a layer of a metal.

16. The manufacturing method according to claim 13, wherein said first and second conductive films are formed simultaneously.

17. The manufacturing method according to claim 16, wherein the collector and emitter areas, and the source and drain areas, are formed simultaneously.

18. The manufacturing method according to claim 13, wherein the collector and emitter areas, and the source and drain areas, are formed simultaneously.

19. The manufacturing method according to claim 13, wherein the semiconductor substrate is of one conductivity type, and the method comprises the further steps of:
   forming a well region in the semiconductor substrate of conductivity type opposite to said one conductivity type;
   forming a thin insulating film on a portion of said well region;
   forming a further conductive film on said thin insulating film;
   forming source and drain regions in said well region using said further conductive film as a mask; and
   forming further conductor layers connected to said source and drain regions.

20. The manufacturing method according to claim 19, wherein said well region is formed in said semiconductor substrate adjacent to the region beneath said second insulating film.

21. The manufacturing method according to claim 19, wherein said thin insulating film is formed simultaneously with said second insulating film.

22. The manufacturing method according to claim 13, wherein said semiconductor substrate comprises a semiconductor layer formed on a substrate.

23. The manufacturing method according to claim 13, wherein the conductive material layer is made of a high melting point conductive material, whereby the first and second conductive films are made of a high melting point conductive material.

24. The manufacturing method according to claim 23, wherein the conductor layer is a metal layer.

25. The manufacturing method according to claim 24, wherein the high melting point conductive material is selected from the group consisting of polycrystalline silicon having impurities added thereto, molybdenum and tungsten.

26. The manufacturing method according to claim 23, wherein said high melting point conductive material is a high melting point metal.

27. The manufacturing method according to claim 13, wherein the emitter and collector areas are formed at locations such that said first conductive film covers an area of said one principal surface between the emitter and collector areas.

28. A manufacturing method for forming a semiconductor device, comprising the steps of:
   forming a first insulating film on one principal surface of a semiconductor substrate;
   forming a conductive film on said first insulating film;
   removing said conductive film selectively to leave said conductive film at a given portion on said first insulating film;
   selectively forming emitter and collector areas in surface regions extending to said one principal surface of said semiconductor layer by introducing impurities;
   forming a second insulating film at least on the given portion of the conductive film left on the first insulating film;
   removing said second insulating film selectively to expose at least a part of the given portion of the conductive film left on the first insulating film; and
   forming a conductor layer connecting the exposed part of the given portion of the conductive film and the emitter area or collector area.

29. The manufacturing method according to claim 28, wherein the conductive film is made of a high melting point conductive material.

30. The manufacturing method according to claim 29, wherein the semiconductor substrate is a semiconductor layer formed on a substrate.

31. The manufacturing method according to claim 30, wherein the conductor layer is made of a metal.

32. The manufacturing method according to claim 31, wherein the conductor layer connects the exposed part of the given portion of the conductive film and said emitter area.

33. The manufacturing method according to claim 28, wherein the emitter and collector areas are formed at locations such that the conductive film selectively left at a given portion on said first insulating film covers an area of said one principal surface between said emitter and collector areas.

* * * * *